(12) United States Patent
Schmidt et al.

(10) Patent No.: US 10,553,675 B2
(45) Date of Patent: Feb. 4, 2020

(54) ISOLATION OF SEMICONDUCTOR DEVICE WITH BURIED CAVITY

(71) Applicant: Infineon Technologies AG, Neubiberg (DE)

(72) Inventors: Sebastian Schmidt, Munich (DE); Donald Dibra, Munich (DE); Oliver Hellmund, Neubiberg (DE); Peter Irsigler, Obernberg/Inn (AT); Andreas Meiser, Sauerlach (DE); Hans-Joachim Schulze, Taufkirchen (DE); Martina Seider-Schmidt, Munich (DE); Robert Wiesner, Bad Aibling (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/785,627

(22) Filed: Oct. 17, 2017

(65) Prior Publication Data

US 2018/0108675 A1 Apr. 19, 2018

(30) Foreign Application Priority Data

Oct. 18, 2016 (DE) .......................... 10 2016 119 799

(51) Int. Cl.
*H01L 29/06* (2006.01)
*H01L 21/02* (2006.01)
(Continued)

(52) U.S. Cl.
CPC .... *H01L 29/0649* (2013.01); *H01L 21/02164* (2013.01); *H01L 21/02236* (2013.01);
(Continued)

(58) Field of Classification Search
CPC .......... H01L 27/1203; H01L 21/02164; H01L 21/02236; H01L 21/02532; H01L 21/26533; H01L 21/76267; H01L 21/76283; H01L 21/84; H01L 21/02255; H01L 29/0649–0653; H01L 29/4983;
(Continued)

(56) References Cited

U.S. PATENT DOCUMENTS 4,888,300 A * 12/1989 Burton .............. H01L 21/30604
438/404
5,466,630 A * 11/1995 Lur ................... H01L 21/76264
257/E21.564

(Continued)

OTHER PUBLICATIONS

Lee, Ming-Chang M. et al., "Thermal Annealing in Hydrogen for 3-D Profile Transformation on Silicon-on-Insulator and Sidewall Roughness Reduction", Journal of Microelectromechanical Systems, vol. 15, No. 2, Apr. 2006, pp. 338-343.

(Continued)

*Primary Examiner* — Scott B Geyer
(74) *Attorney, Agent, or Firm* — Murphy, Bilak & Homiller, PLLC

(57) ABSTRACT

In accordance with an embodiment of an integrated circuit, a cavity is buried in a semiconductor body below a first surface of the semiconductor body. An active area portion of the semiconductor body is arranged between the first surface and the cavity. The integrated circuit further includes a trench isolation structure configured to provide a lateral electric isolation of the active area portion.

8 Claims, 13 Drawing Sheets

(51) Int. Cl.
*H01L 21/265* (2006.01)
*H01L 21/762* (2006.01)
*H01L 21/84* (2006.01)
*H01L 27/12* (2006.01)

(52) U.S. Cl.
CPC .. *H01L 21/02532* (2013.01); *H01L 21/26533* (2013.01); *H01L 21/76267* (2013.01); *H01L 21/76283* (2013.01); *H01L 21/84* (2013.01); *H01L 27/1203* (2013.01); *H01L 21/02255* (2013.01)

(58) Field of Classification Search
CPC ......... H01L 29/4991; H01L 21/76–765; H01L 21/823481; H01L 21/823878; H02M 7/537; H02M 7/5387; H02P 7/04
See application file for complete search history.

(56) References Cited

U.S. PATENT DOCUMENTS

| | | | |
|---|---|---|---|
| 5,972,758 A * | 10/1999 | Liang | H01L 21/762 257/E21.433 |
| 6,448,115 B1 * | 9/2002 | Bae | H01L 21/76264 257/E21.564 |
| 6,551,944 B1 * | 4/2003 | Fallica | H01L 21/76232 148/33.2 |
| 6,566,240 B2 | 5/2003 | Udrea et al. | |
| 6,570,217 B1 * | 5/2003 | Sato | H01L 21/324 257/327 |
| 6,703,684 B2 | 3/2004 | Urdea et al. | |
| 6,727,186 B1 | 4/2004 | Skotnicki et al. | |
| 7,009,273 B2 * | 3/2006 | Inoh | H01L 21/76283 257/499 |
| 7,135,752 B2 | 11/2006 | Akiyama et al. | |
| 7,235,456 B2 * | 6/2007 | Sato | B82Y 20/00 257/522 |
| 7,372,086 B2 * | 5/2008 | Sato | H01L 21/3247 257/250 |
| 7,507,634 B2 * | 3/2009 | Sato | B82Y 20/00 257/E21.564 |
| 7,667,267 B2 * | 2/2010 | Yamada | H01L 29/0653 257/335 |
| 7,671,390 B2 * | 3/2010 | Sonsky | H01L 21/76264 257/288 |
| 7,846,811 B2 * | 12/2010 | Villa | H01L 21/76264 438/400 |
| 7,884,002 B2 | 2/2011 | Muller | |
| 7,906,388 B2 * | 3/2011 | Sonsky | H01L 21/76264 257/368 |
| 7,989,296 B2 * | 8/2011 | Lee | H01L 29/66772 257/E21.43 |
| 8,106,468 B2 * | 1/2012 | Wang | H01L 29/0649 257/276 |
| 8,334,188 B2 * | 12/2012 | Villa | H01L 21/3003 257/E21.573 |
| 8,530,964 B2 | 9/2013 | Hirler et al. | |
| 8,716,752 B2 | 5/2014 | Dove | |
| 8,791,506 B2 * | 7/2014 | Taylor | H01L 21/76283 257/203 |
| 9,620,506 B2 * | 4/2017 | Loubet | H01L 27/092 |
| 9,646,993 B2 * | 5/2017 | Cheng | H01L 27/0207 |
| 9,935,126 B2 * | 4/2018 | Laven | H01L 21/02233 |
| 2004/0104448 A1 | 6/2004 | Marty et al. | |
| 2004/0217434 A1 * | 11/2004 | Lee | H01L 21/76224 257/412 |
| 2004/0235262 A1 * | 11/2004 | Lee | H01L 21/76264 438/411 |
| 2006/0208342 A1 * | 9/2006 | Choi | H01L 21/263 257/618 |
| 2007/0181920 A1 | 8/2007 | Renna et al. | |
| 2007/0190743 A1 * | 8/2007 | Colombo | H01L 21/76281 438/424 |
| 2008/0003771 A1 * | 1/2008 | Sato | B82Y 20/00 438/411 |
| 2008/0142923 A1 * | 6/2008 | Tischler | H01L 21/764 257/531 |
| 2012/0018806 A1 * | 1/2012 | Furukawa | H01L 21/84 257/347 |
| 2012/0094456 A1 * | 4/2012 | Wang | H01L 29/0649 438/285 |
| 2012/0267750 A1 * | 10/2012 | Imai | H01L 27/0248 257/495 |
| 2013/0193531 A1 * | 8/2013 | Nishikawa | H01L 29/84 257/415 |
| 2014/0273383 A1 * | 9/2014 | Vellianitis | H01L 21/76264 438/285 |
| 2015/0014783 A1 * | 1/2015 | Imai | H01L 21/823878 257/372 |
| 2015/0029627 A1 | 1/2015 | Mauder et al. | |
| 2015/0145043 A1 * | 5/2015 | Huang | H01L 27/1203 257/347 |
| 2015/0332956 A1 * | 11/2015 | Bieselt | H01L 23/564 257/510 |
| 2016/0071963 A1 * | 3/2016 | Chan | H01L 29/7394 257/139 |
| 2016/0079282 A1 * | 3/2016 | Sonsky | H01L 21/76264 257/192 |
| 2016/0093523 A1 * | 3/2016 | Jaffe | H01L 29/0649 438/422 |
| 2016/0155707 A1 * | 6/2016 | Huang | H01L 27/1203 438/150 |
| 2016/0293695 A1 * | 10/2016 | Xu | H01L 29/0649 |

OTHER PUBLICATIONS

Sato, Tsutomu et al., "Fabrication of Silicon-on-Nothing Structure by Substrate Engineering Using the Empty-Space-in-Silicon Formation Technique", Japanese Journal of Applied Physics, vol. 43, No. 1, 2004, pp. 12-18.

Sato, Tsutomu et al., "Trench Transformation Technology using Hydrogen Annealing for Realizing Highly Reliable Device Structure with Thin Dielectric Films", 1998 Symposium on VLSI Technology Digest of Technical Papers, pp. 206-207.

Udrea, F. et al., "Membrane High Voltage Devices—A Milestone Concept in Power ICs", IEEE International Electron Devices Meeting, Dec. 2004, IEDM Technical Digest, pp. 451-454.

Udrea, F. et al., "Ultra-fast LIGBTs and superjunction devices in membrane technology", Proceedings of the 17th International Symposium on Power Semiconductor Devices & IC's, May 2005, pp. 1-3, 162.

* cited by examiner

ISOLATION OF SEMICONDUCTOR DEVICE WITH BURIED CAVITY

BACKGROUND

In silicon devices such as insulated gate bipolar transistors (IGBTs), diodes, insulated gate field effect transistors (IGFETs), for example metal oxide semiconductor field effect transistors (MOSFETs) or complementary metal oxide semiconductor (CMOS) a number of requirements need to be met. Such requirements depend upon specific application conditions. Requirements on minimum breakdown voltages between load terminals such as drain and source or cathode and anode, requirements on functional safety as well as requirements on maximum leakage currents need to be met for fulfilling target product specifications In order to meet with these demands, is desirable to provide an integrated circuit and a method for manufacturing an integrated circuit.

SUMMARY

The present disclosure relates to an integrated circuit. The integrated circuit includes a cavity buried in a semiconductor body below a first surface of the semiconductor body. The integrated circuit further includes an active area portion of the semiconductor body arranged between the first surface and the cavity. The integrated circuit further includes a trench isolation structure configured to provide a lateral electric isolation of the active area portion.

The present disclosure also relates to a method of manufacturing an integrated circuit. The method comprises forming a cavity buried in a semiconductor body below a first surface of the semiconductor body, wherein an active area portion of the semiconductor body remains between the surface and the cavity. The method further comprises forming a trench isolation structure in the semiconductor body configured to provide a lateral electric isolation of the active area portion.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the disclosure and are incorporated in and constitute a part of this specification. The drawings illustrate the embodiments of the present disclosure and together with the description serve to explain principles of the disclosure. Other embodiments and intended advantages will be readily appreciated as they become better understood by reference to the following detailed description.

DETAILED DESCRIPTION

Figure 1:
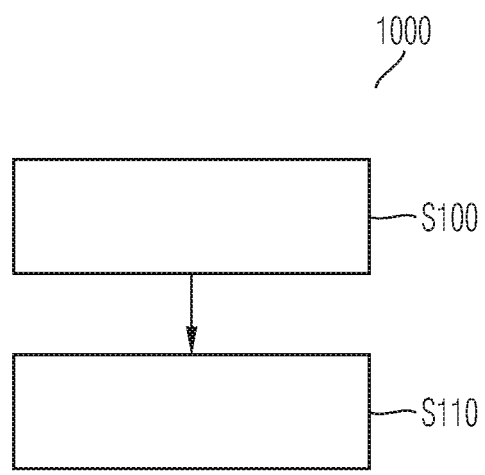
FIG. 1 is a schematic process chart for illustrating a method of manufacturing an integrated circuit.

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open and the terms indicate the presence of stated structures, elements or features but not preclude the presence of additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may exist between the electrically coupled elements, for example elements that temporarily provide a low-ohmic connection in a first state and a high-ohmic electric decoupling in a second state.

The Figures illustrate relative doping concentrations by indicating "−" or "+" next to the doping type "n" or "p". For example, "n−" means a doping concentration that is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

The terms "wafer", "substrate", "semiconductor body" or "semiconductor substrate" used in the following description may include any semiconductor-based structure that has a semiconductor surface. Wafer and structure are to be understood to include silicon (Si), silicon-on-insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could as well be silicon germanium (SiGe), germanium (Ge) or gallium arsenide (GaAs). According to other embodiments, silicon carbide (SiC) or gallium nitride (GaN) may form the semiconductor substrate material.

The term "horizontal" as used in this specification intends to describe an orientation substantially parallel to a first or main surface of a semiconductor substrate or body. This can be for instance the surface of a wafer or a die.

The term "vertical" as used in this specification intends to describe an orientation which is substantially arranged perpendicular to the first surface, i.e. parallel to the normal direction of the first surface of the semiconductor substrate or body.

In this specification, a second surface of a semiconductor substrate or semiconductor body is considered to be formed by the lower or backside surface while the first surface is considered to be formed by the upper, front or main surface of the semiconductor substrate. The terms "above" and "below" as used in this specification therefore describe a relative location of a structural feature to another In this specification, n-doped is referred to as first conductivity type while p-doped is referred to as second conductivity type. Alternatively, the semiconductor devices can be formed with opposite doping relations so that the first conductivity type can be p-doped and the second conductivity type can be n-doped.

Processing of a semiconductor wafer may result in semiconductor devices having terminal contacts such as contact pads (or electrodes) which allow electrical contact to be made with the integrated circuits or discrete semiconductor devices included in the semiconductor body. The electrodes may include one or more electrode metal layers which are applied to the semiconductor material of the semiconductor chips. The electrode metal layers may be manufactured with any desired geometric shape and any desired material composition. The electrode metal layers may, for example, be in the form of a layer covering an area. Any desired metal, for example Cu, Ni, Sn, Au, Ag, Pt, Pd, and an alloy of one or more of these metals may be used as the material. The electrode metal layer(s) need not be homogenous or manufactured from just one material, that is to say various compositions and concentrations of the materials contained in the electrode metal layer(s) are possible. As an example, the electrode layers may be dimensioned large enough to be bonded with a wire.

In embodiments disclosed herein one or more conductive layers, in particular electrically conductive layers, are applied. It should be appreciated that any such terms as "formed" or "applied" are meant to cover literally all kinds and techniques of applying layers. In particular, they are meant to cover techniques in which layers are applied at once as a whole like, for example, laminating techniques as well as techniques in which layers are deposited in a sequential manner like, for example, sputtering, plating, molding, CVD (Chemical Vapor Deposition), physical vapor deposition (PVD), evaporation, hybrid physical-chemical vapor deposition (HPCVD), etc.

The applied conductive layer may comprise, inter alia, one or more of a layer of metal such as Cu or Sn or an alloy thereof, a layer of a conductive paste and a layer of a bond material. The layer of a metal may be a homogeneous layer. The conductive paste may include metal particles distributed in a vaporizable or curable polymer material, wherein the paste may be fluid, viscous or waxy. The bond material may be applied to electrically and mechanically connect the semiconductor chip, e.g., to a carrier or, e.g., to a contact clip. A soft solder material or, in particular, solder material capable of forming diffusion solder bonds may be used, for example solder material comprising one or more of Sn, SnAg, SnAu, SnCu, In, InAg, InCu and InAu.

A dicing process may be used to divide the semiconductor wafer into individual chips. Any technique for dicing may be applied, e.g., blade dicing (sawing), laser dicing, etching, etc. The semiconductor body, for example a semiconductor wafer may be diced by applying the semiconductor wafer on a tape, in particular a dicing tape, apply the dicing pattern, in particular a rectangular pattern, to the semiconductor wafer, e.g., according to one or more of the above mentioned techniques, and pull the tape, e.g., along four orthogonal directions in the plane of the tape. By pulling the tape, the semiconductor wafer gets divided into a plurality of semiconductor dies (chips).

FIG. 1 is a schematic flow diagram for illustrating a method 1000 of an integrated circuit.

It will be appreciated that while method 1000 is illustrated and described below as a series of acts or events, the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects of embodiments of the disclosure herein. Also, one or more of the acts depicted herein may be carried out in one or more separate act and/or phases.

Process feature S100 includes forming a cavity buried in a semiconductor body below a first surface of the semiconductor body, wherein an active area portion of the semiconductor body remains between the first surface and the cavity. The semiconductor body may include a semiconductor substrate and none, one or more semiconductor layers thereon.

Process feature S110 includes forming a trench isolation structure in the semiconductor body configured to provide a lateral electric isolation of the active area portion.

Further processes may be carried out before, after, together with or between the process features S100 and S110 described above. These processes may include Front-end-of-line (FEOL) processes and Back-end-of-line (BEOL) processes. FEOL processes are the first processes in integrated circuit or discrete semiconductor fabrication, involving the formation of devices including transistors, capacitors, resistors, and more directly in the silicon wafer, for example by masked and/or unmasked doping processes such as ion implantation and diffusion out of a dopant reservoir, etch processes, conductive and/or insulating layer deposition processes. BEOL processing involves a series of processes used to prepare integrated circuits for use. These processes include interconnects, wafer thinning, wafer dicing, inspection, die sort and final packaging, for example. The devices in the silicon wafer may be interconnected to provide a desired electrical circuit functionality. Wires such as patterned metallization layers isolated by dielectric layers may be used to interconnect the individual devices.

In some embodiments, forming the cavity includes forming a first semiconductor layer of a first material on a semiconductor substrate of a second material different from the first material. The embodiment further includes forming a second semiconductor layer of the second material on the first semiconductor layer. The embodiment further includes forming a process trench extending through the second semiconductor layer to the first semiconductor layer. The embodiment further includes forming the cavity by removing the first material selective to the second material. The trench isolation structure in the semiconductor body may be formed by partly or completely filling the process trench with an insulating material. In some embodiments, the first material is SiGe and the second material is Si. The first and second materials may be chosen such that the first material may be etched selectively with regard to the second material, for example.

In some embodiments, forming the cavity includes forming a trench array in the semiconductor body at the first surface. The embodiment further includes transforming the trench array into the cavity by self-organized recrystallization caused by silicon surface migration during an annealing process in an deoxidizing ambient. Annealing may be carried out in a hydrogen ambient, for example at a temperature in a range of 1000° C. to 1200° C., for example at 1100° C., at a pressure of some or some tens of Torr, and a duration of several to several tens of minutes. When closely arranging a plurality of trenches in an array, for example a lattice, a shape of the trenches is transformed by surface migration into an empty-space-in-silicon (EES). Then, these EESs are combined, resulting in the cavity buried in the semiconductor body.

In some embodiments, the cavity is formed as collapsed vacancy clusters by a high dose particle implantation process. The particles may be chosen as one or more of protons ($H^+$), helium (He), argon (Ar), silicon (Si) and oxygen (O). The high dose implantation process may be masked by forming an ion implantation mask on the first surface. Typical implantation energies of the vacancy-generating species range between 12 keV to 25 MeV. Typical doses of the vacancy-generating species range between $1 \times 10^{12}$ cm$^{-2}$ to $1 \times 10^{17}$ cm$^2$. Typical annealing temperatures range between 400° C. and 1000° C., or from 400° C. to 800° C., for example.

In some embodiments, the method further comprises forming a process trench in the semiconductor body extending to or through the cavity. The process trench may be used for removing material out of or for introducing material and/or process gases into the cavity. In some embodiments, the method further comprises forming an insulating layer lining a surface of the cavity by introducing a process gas into the cavity through the process trench. In some embodiments, the insulating layer is formed by thermal oxidation of silicon. The insulating layer lining a surface of the cavity may contribute to a further reduction of leakage current(s), for example substrate leakage current and to an increase of a breakdown voltage, for example an electric breakdown to the substrate.

In some embodiments, forming the trench isolation structure includes forming a trench structure in the semiconductor body at the first surface, the trench structure surrounding the active area portion and including one or more trench segments, wherein some or all of the one or more trench segments and the cavity are spaced at a vertical distance from one another. The embodiments further includes forming a thermal oxide in the trench structure. Setting a lateral distance between neighboring trench segments may be configured to merge oxides in neighboring trench segments after material consumption of a mesa region between the neighboring trench segments during the thermal oxidation process such that thermal oxidation results. Likewise, setting the vertical distance between trench segments and the cavity may be configured to merge an oxide at a bottom side of the trench segments and an oxide lining a surface of the cavity after material consumption of a material portion of the semiconductor body sandwiched between a bottom side of the trench segments and the cavity, for example. In case that the cavity is not lined by an oxide or dielectric layer, the thermal oxidation process may end when the oxide reaches the cavity, for example. Apart from acting as a material reservoir during thermal oxidation, the mesa region between trench segments or the material portion of the semiconductor body sandwiched between a bottom side of the trench segments and the cavity may mechanically support and stabilize the active area portion surrounded by the trench segments and the cavity, for example. Thereby, peeling off the active area portion may be counter-acted and prevented.

An embodiment of a method of manufacturing an integrated circuit is illustrated with reference to the schematic cross-sectional views of a semiconductor body illustrated in FIGS. 2A to 2H.

Figure 2A:
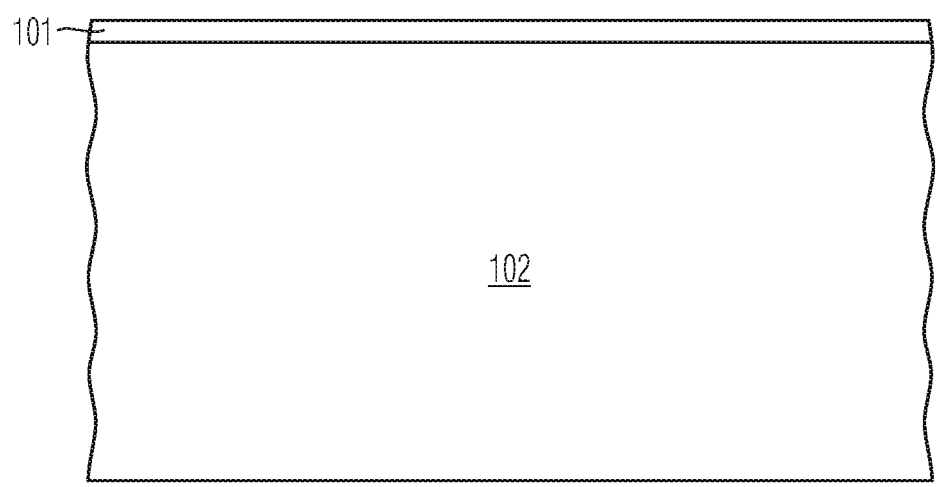
FIGS. 2A to 2H are schematic cross-sectional views of a semiconductor body for illustrating an embodiment of a method of manufacturing an integrated circuit.

Referring to the schematic cross-sectional illustrated in FIG. 2A, a first semiconductor layer 101 of a first material is formed on a semiconductor substrate 102 of a second material different from the first material. The first semiconductor layer 101 may be formed by a layer deposition process, for example epitaxial growth. The first and second materials may be chosen such that the first material may be etched selectively with regard to the second material, for example. In some embodiments, the first material is SiGe and the second material is Si.

Figure 2B:
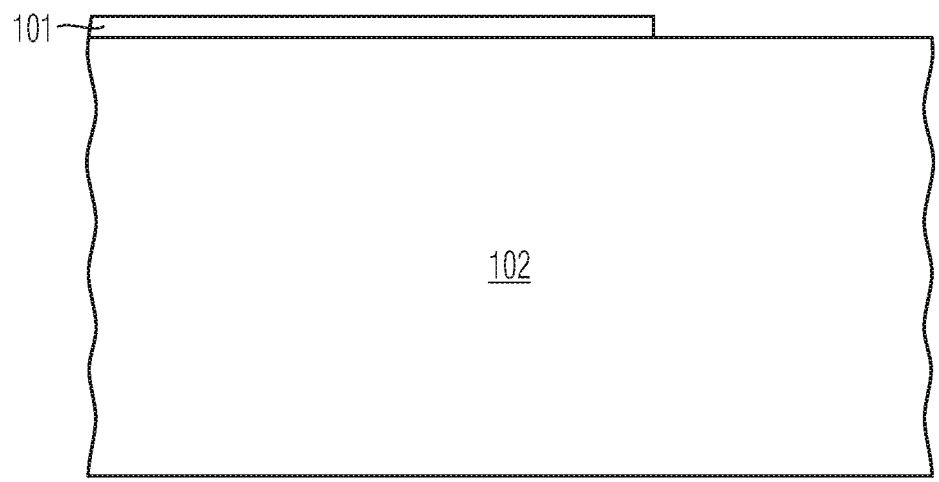

Referring to the schematic cross-sectional illustrated in FIG. 2B, the first semiconductor layer 101 is patterned, for example by a lithographic etch process using an etch mask.

Figure 2C:
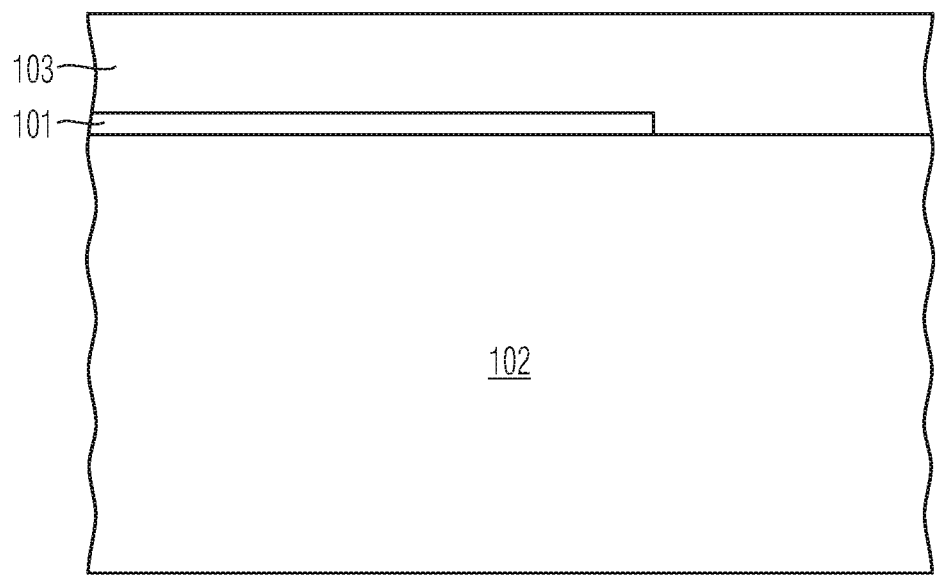

Referring to the schematic cross-sectional illustrated in FIG. 2C, a second semiconductor layer 103 of the second material is formed on the first semiconductor layer 101 and on exposed parts of the semiconductor substrate 102. Optional processes for leveling a surface of the second semiconductor layer 103 may follow, for example. Apart from the second semiconductor layer 103, one or more additional layers may be formed resulting in a layer stack on the first semiconductor layer 101. The layer stack may also include one or more layers of the second material or another material that is configured to achieve a desired function within the active area portion, for example introducing tensile or compressive stress for enhancing mobility of charge carriers. The semiconductor substrate 102, the first semiconductor layer 101 and the second semiconductor layer 103 and any optional layer(s) thereon constitute a semiconductor body 104.

Figure 2D:
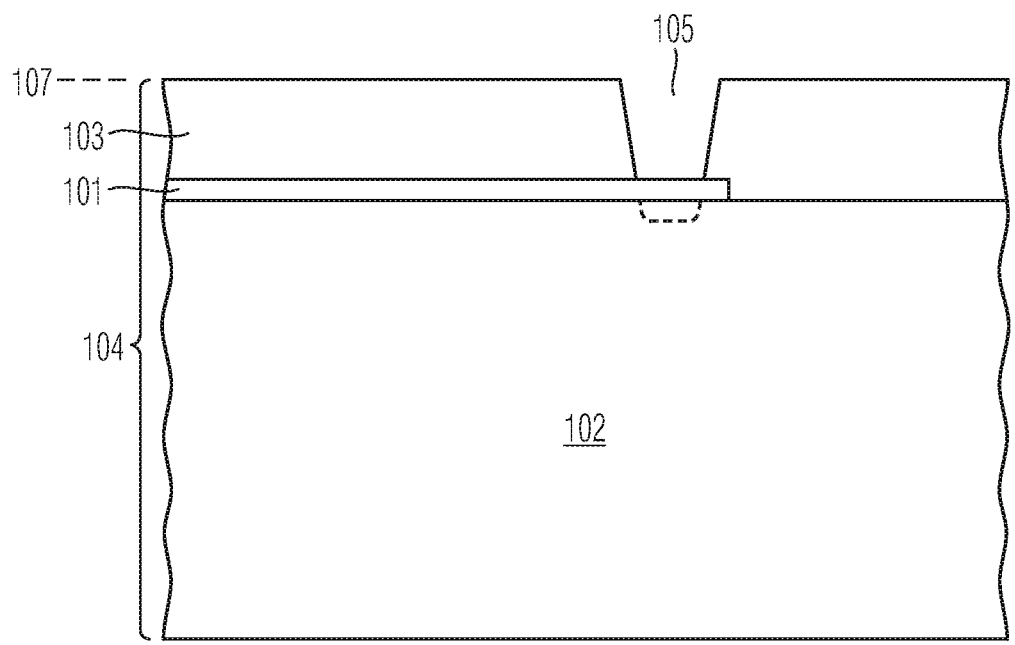

Referring to the schematic cross-sectional illustrated in FIG. 2D, a process trench 105 is formed in the semiconductor body at a first surface 107 extending through the second semiconductor layer 103 to the first semiconductor layer 101, or optionally (as is illustrated by a dashed line in FIG. 2D) through the first semiconductor layer 101 and into the semiconductor substrate 102. The process trench 105 may be formed by an anisotropic etch process, for example reactive ion etching (RIE) using an etch mask defined by a lithographic process, for example.

Figure 2E:
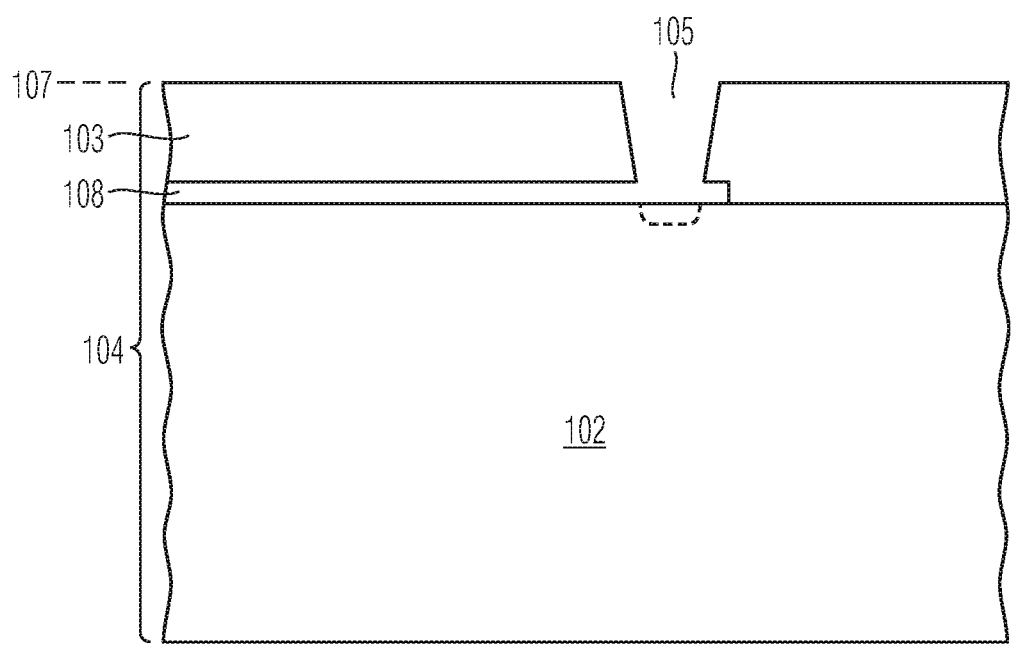

Referring to the schematic cross-sectional view illustrated in FIG. 2E, a cavity 108 is formed in the semiconductor body 104 by removing the first material of the first semiconductor layer 101 selective to the second material, for example by a selective etch process.

Figure 2F:
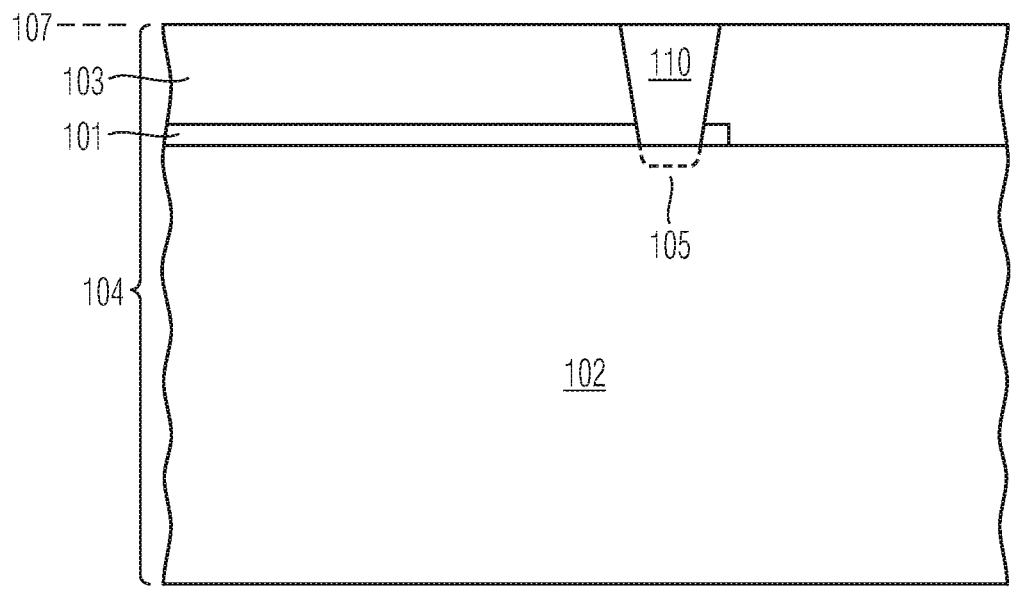

Referring to the schematic cross-sectional view illustrated in FIG. 2F, a trench isolation structure 110 is formed in the process trench 105 to provide a lateral electric isolation. The trench isolation structure 110 may include one or more dielectric material(s), for example silicon oxide(s) and/or silicon nitride(s) lining walls and/or a bottom side of the process trench 105, for example. In some embodiments, the one or more dielectric materials fill up the process trench 105. In some other embodiments, one or more dielectric layers line walls and a bottom side of the process trench 105, and one or more conductive materials, for example polycrystalline silicon or metal may be arranged between the one or more dielectric layers. The one or more dielectric layers may also be absent at a bottom side of the process trench, thereby enabling an electric contact to the semiconductor substrate 102 while securing the lateral electric isolation between neighboring active area portions.

Figure 2G:
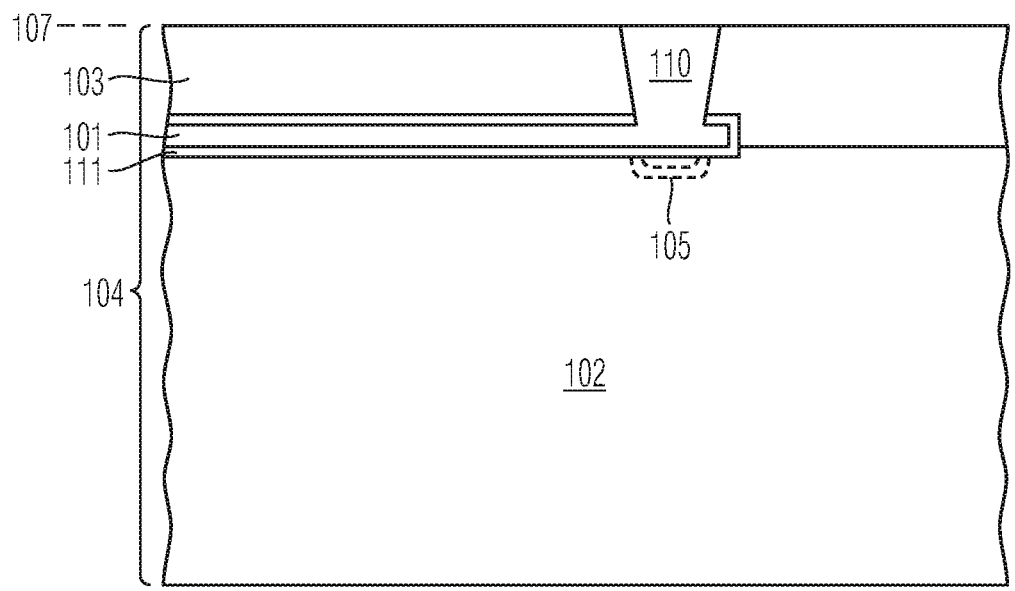

Referring to the schematic cross-sectional view illustrated in FIG. 2G, in addition and prior to the processes carried out for forming the trench isolation structure 110 illustrated in FIG. 2F, a thermal oxidation process is carried out, resulting in a thermal oxide 111 lining a surface the cavity 108 and constituting an outermost part of the trench isolation structure 110. The thermal oxide 111 may further reduce undesired leakage currents of semiconductor devices formed in an active device area sandwiched between the first surface 107 and the cavity 108 into the semiconductor substrate 102.

Figure 2H:
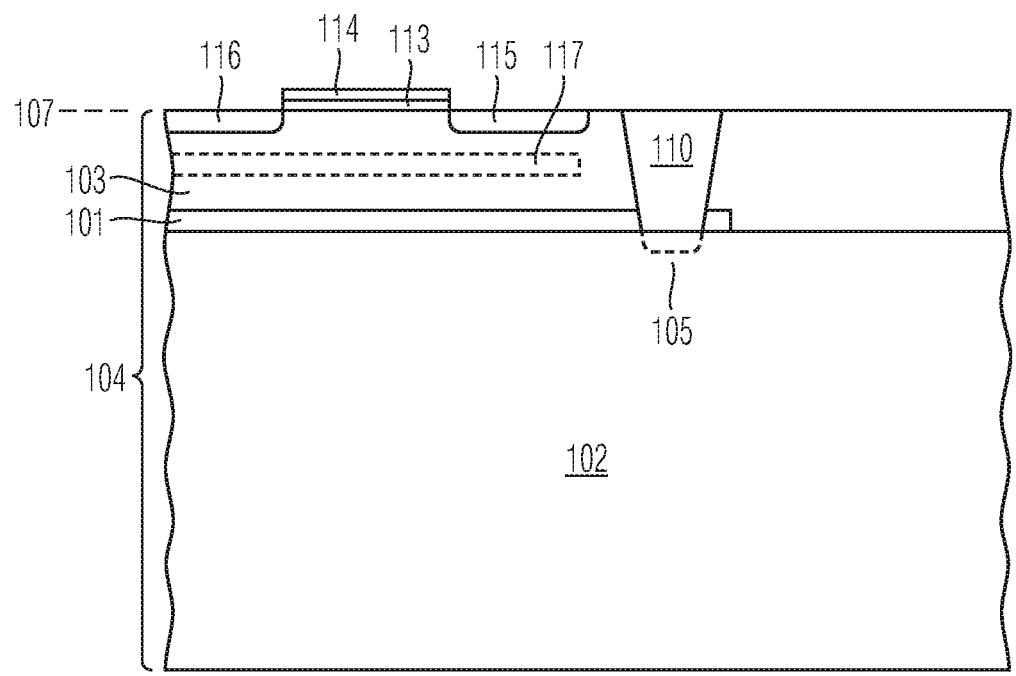

Referring to the schematic cross-sectional view illustrated in FIG. 2H, various semiconductor devices may be formed in an active area portion 112 electrically isolated from surrounding parts of the semiconductor body 104 by the trench isolation structure 110. The trench isolation structure 110 may surround the active area portion 112 at the first surface 107, for example. Processes for forming the semiconductor device, for example a single semiconductor device in the active area portion 112 may be carried out before, after, together with or between the processes described with reference to FIGS. 2A to 2G. By way of example, processing the process trench 105 may also be used to form further trenches in other areas of the semiconductor body 104, for example gate trenches of IGFETs such as FINFETs. In the embodiment illustrated in FIG. 2H, the semiconductor device formed in the active area portion 112 is an IGFET including a gate dielectric 113 electrically insulating the active area portion 112 and a gate electrode 114 on the gate dielectric 113. The IGFET further includes a drain region 115 and a source region 116. The second semiconductor layer 103 may be formed as a layer stack including a stress inducing layer 117, for example a SiGe layer surrounded by Si for achieving a stress induced mobility enhancement of charge carriers. Apart from the IGFET illustrated in FIG. 2H, any desired semiconductor device may be formed in the active area portion 112, for example an IGBT, a diode, a thyristor.

Figure 3A:
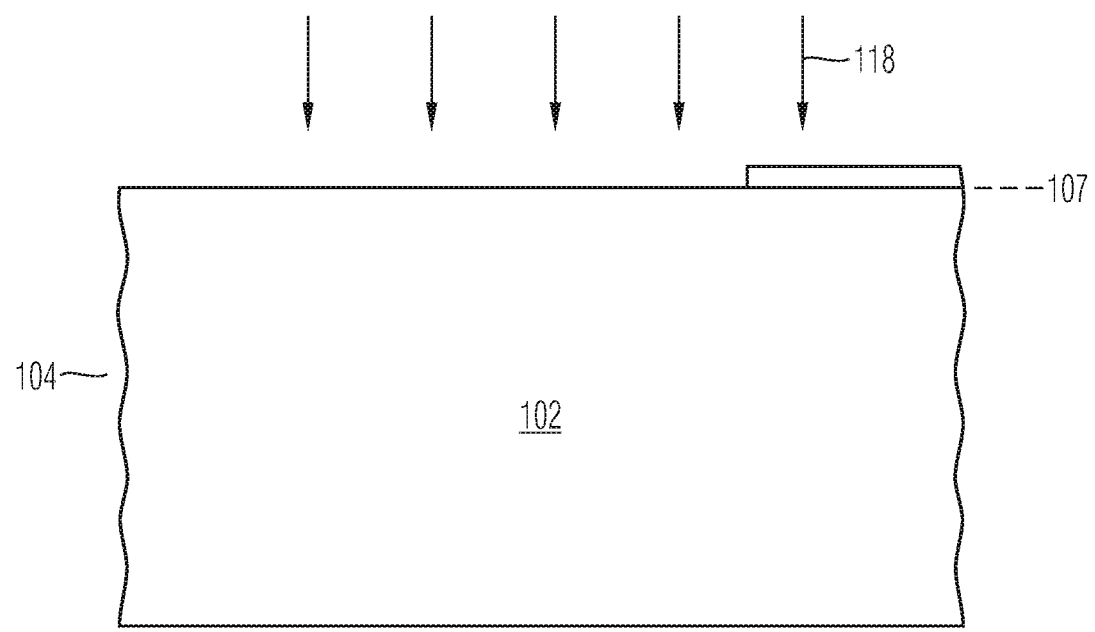
FIGS. 3A and 3B are schematic cross-sectional views of a semiconductor body for illustrating an embodiment of a method of manufacturing a cavity buried in the semiconductor body by collapsed vacancy clusters caused by a high dose particle implantation process.
Figure 3B:
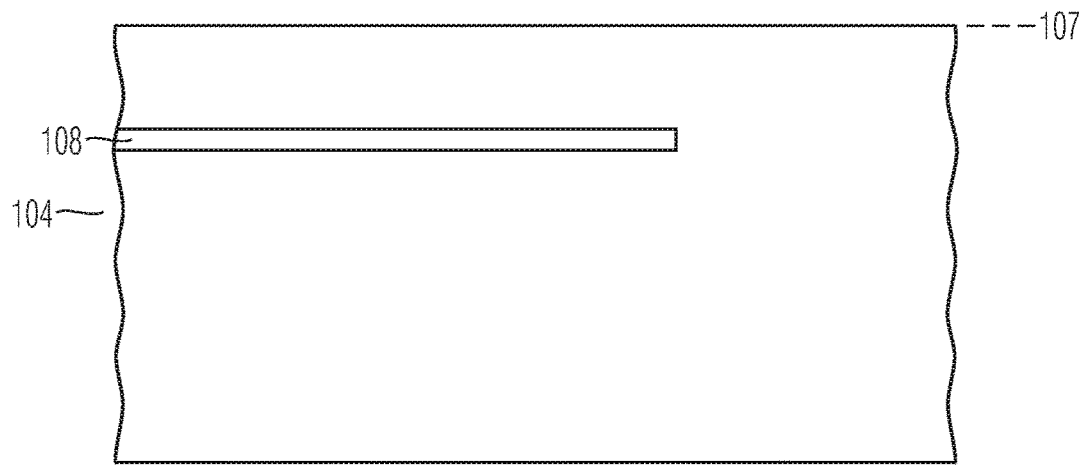

The cavity 108 buried in the semiconductor body 104 may also be formed as collapsed vacancy clusters by a high dose particle implantation process as is illustrated in the schematic cross-sectional view of FIGS. 3A and 3B. Referring to the schematic cross-sectional view of FIG. 3A, the first surface 107 is irradiated with a particle beam 118, for one or more of protons (H$^+$), helium (He), argon (Ar), silicon (Si) and oxygen (O). The particles implanted into the semiconductor body 104 produce both interstitials and vacancies. The interstitials and vacancies may cluster to dislocation loops. The vacancy loops may collapse to voids forming the cavity 108, for example supported by interstitials attracted to a vacancy loop and/or an increased irradiation temperature and/or by void nucleation by gases such as surface active gases, for example oxygen or nitrogen, and inert gases, for example helium. The high dose implantation process may be masked by forming an ion implantation mask on the first surface. Typical implantation energies of the vacancy-generating species range between 12 keV and 25 MeV. Typical doses of the vacancy-generating species range between $1 \times 10^{12}$ cm$^{-2}$ and $1 \times 10^{17}$ cm$^{-2}$. Typical annealing temperatures range between 400° C. and 1000° C.

Figure 4A:
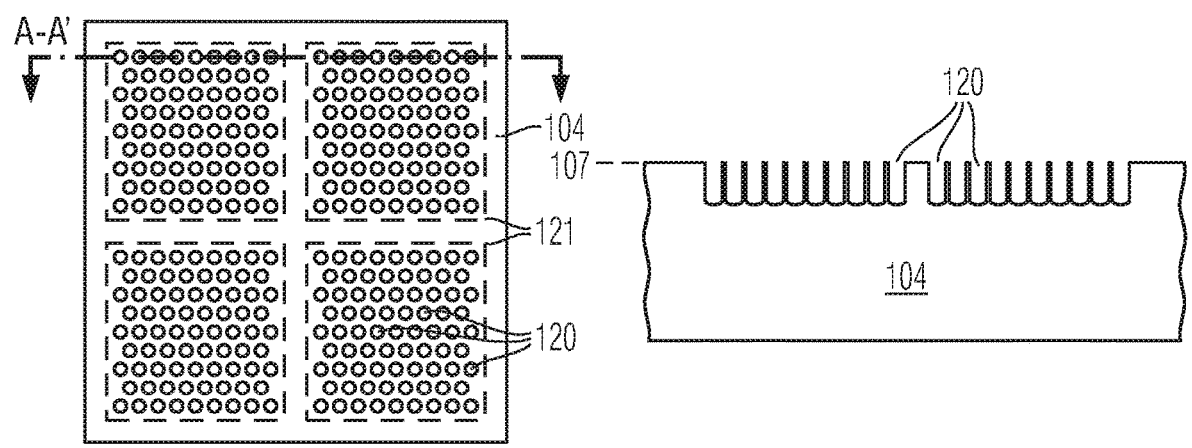
FIGS. 4A to 4C are schematic plan and cross-sectional views of a semiconductor body for illustrating an embodiment of a method of manufacturing a cavity buried in the semiconductor body by self-organized recrystallization caused by silicon surface migration during an annealing process of a trench structure in an deoxidizing ambient.
Figure 4B:
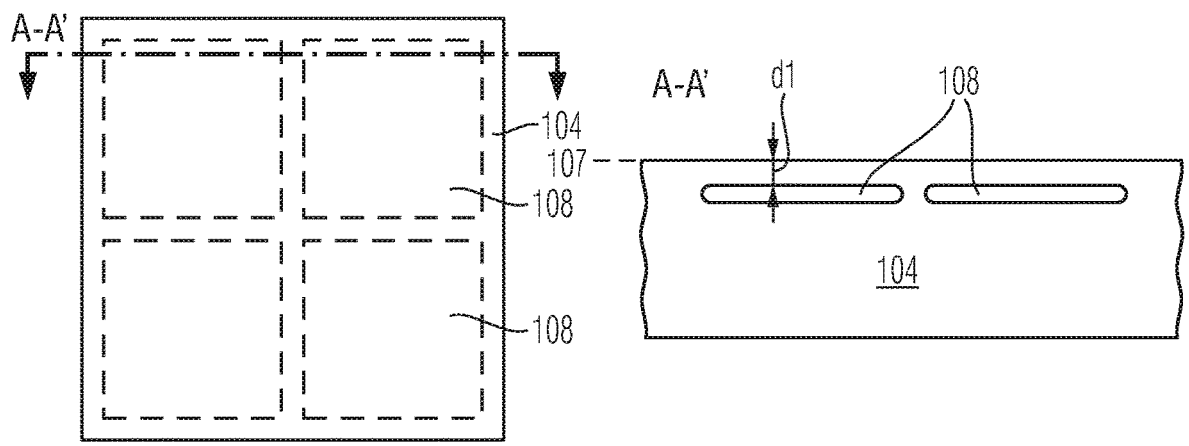

Referring to the schematic cross-sectional and plan views illustrated in FIGS. 4A and 4B, the cavity 108 buried in the semiconductor body 104 may also be formed as collapsed vacancy clusters by transforming a trench array into the cavity by self-organized recrystallization caused by silicon surface migration during an annealing process in an deoxidizing ambient.

Referring to the schematic cross-sectional and plan views illustrated in FIG. 4A, trenches 120 are formed in the semiconductor body 104 at the first surface 107. The trenches may be grouped in arrays 121 of trenches 120. Each of the arrays 121 may define an active area portion or a plurality of active area portions to be formed in subsequent processes. Typical lateral dimensions of the trenches 120 may range from several tens of nanometers to several hundreds of nanometers. Typical lateral distances between the trenches 120 of one of the arrays 121 may also range from several tens of nanometers to several hundreds of nanometers. Typical aspect ratios of the trenches 120 may range from 1 to 20.

Referring to the schematic cross-sectional and plan views illustrated in FIG. 4B, annealing is carried out in a hydrogen ambient, for example at a temperature in a range of 1000° C. to 1200° C., for example at 1100° C., at a pressure of some or some tens of Torr, and a duration of several to several tens of minutes. Annealing transforms the trenches 120 of each array 121 into the cavity 108 by self-organized recrystallization caused by surface migration of silicon.

Figure 4C:
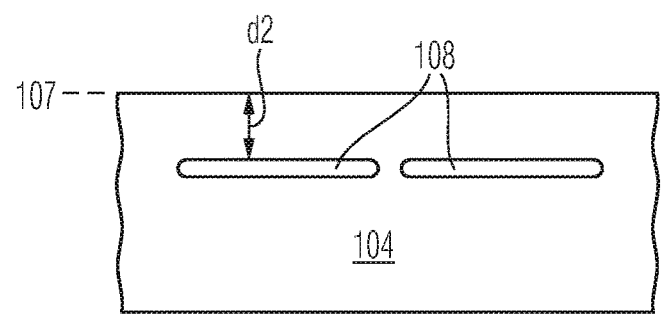

Referring to the schematic cross-sectional view of FIG. 4C, a thickness of the semiconductor body 104 may be increased by forming one or more semiconductor layers on the first surface 107. Thereby, a thickness d1 of a semiconductor body portion between the cavity 108 and the first surface 107 may be enlarged to a thickness d2, d2>d1. The thickness d2 may be set with respect to functional requirements of semiconductor devices formed in the respective semiconductor body portions, for example.

FIGS. 5A to 5D illustrate embodiments of forming a trench isolation structure in the semiconductor body 104 configured to provide a lateral electric isolation of an active area portion.

Figure 5A:
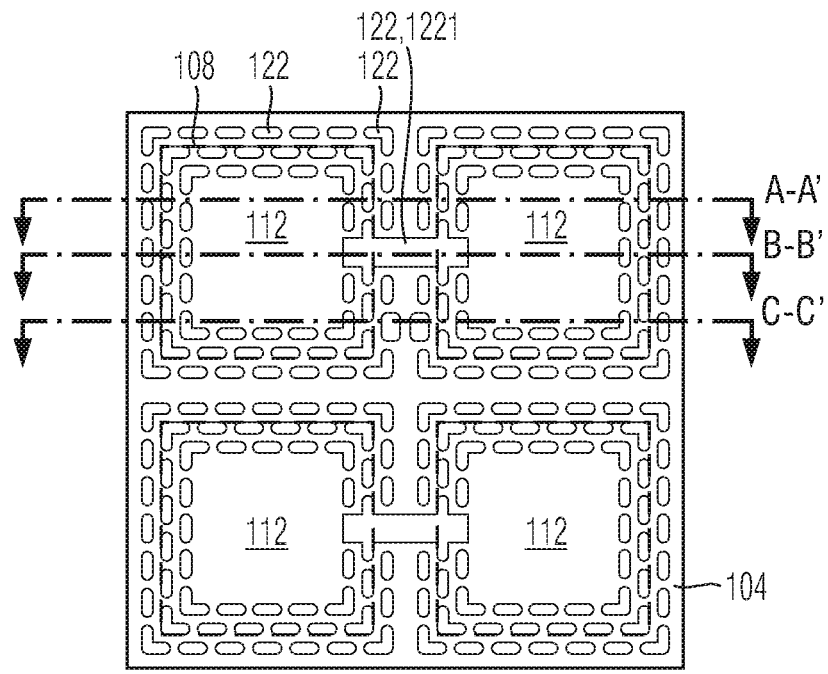
FIGS. 5A to 5D and FIGS. 6A to 6D are schematic plan and cross-sectional views of the semiconductor body illustrated in FIGS. 4A to 4C for illustrating an embodiment of a method of forming a trench isolation structure in the semiconductor body 104 configured to provide a lateral electric isolation of an active area portion.

Referring to the schematic plan view of FIG. 5A, a trench structure is formed in the semiconductor body 104 at the first surface 107, the trench structure surrounding the active area portion 112 and including trench segments 122.

Figure 5B:
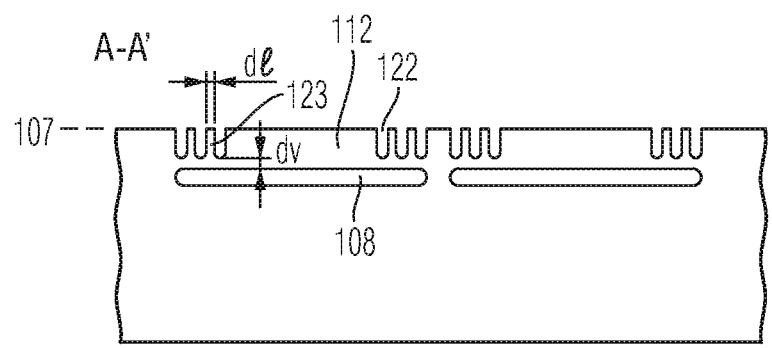

Referring to the schematic cross-sectional view of FIG. 5B along line A-A' of FIG. 5A, some of the trench segments 122 and the cavity 108 are spaced at a vertical distance dv from one another. Setting a lateral distance dl between neighboring trench segments 122 may be configured to merge oxides in neighboring trench segments 122 after material consumption of a mesa region 123 between the neighboring trench segments 122 during a subsequent thermal oxidation process. Likewise, the vertical distance dv between trench segments 122 and the cavity 108 may be configured to merge an oxide at a bottom side of the trench segments 122 and an oxide lining a surface of the cavity 108 after material consumption of a material portion of the semiconductor body 104 sandwiched between a bottom side of the trench segments 122 and the cavity 108, for example. In case that the cavity is not lined by an oxide or dielectric layer, the thermal oxidation process may end when the oxide reaches the cavity 108, for example. Apart from acting as material reservoir during thermal oxidation, the mesa regions 123 between trench segments and the material portion of the semiconductor body 104 sandwiched between the bottom side of the trench segments 122 and the cavity 108 mechanically support and stabilize the active area portion 112 surrounded by the trench segments 122 and the cavity 108, for example. Thereby, peeling off the active area portion 112 may be prevented.

Apart from trench segments 122 being spaced at a vertical distance from the cavity 108, some trench segments 122 may also reach the cavity 108 or even extend through the cavity 108 and into the semiconductor body 104 below the cavity 108.

Referring to the schematic cross-sectional view of FIG. 5C along line B-B' of FIG. 5A, a trench segment 1221 reaches the cavity 108 and even extends through the cavity 108 and into the semiconductor body 104 below the cavity 108. The trench segment 1221 thus provides access to the cavity 108. Thus, the area in and around the cavity 108 may be further processed. In case that the cavity 108 is formed by removing material within the cavity selectively to material around the cavity, for example as is illustrated in the schematic cross-sectional views of FIGS. 2D and 2E, such a selective removal, for example by selective etching may be carried out. Access to the cavity 108 also allows for a thermal oxidation of a surface of the cavity 108 toward a surrounding part of the semiconductor body 104, thereby further reducing leakage currents between the active area portion 112 and the semiconductor substrate formed by the semiconductor body 104 below the cavity 108, for example.

Figure 5C:
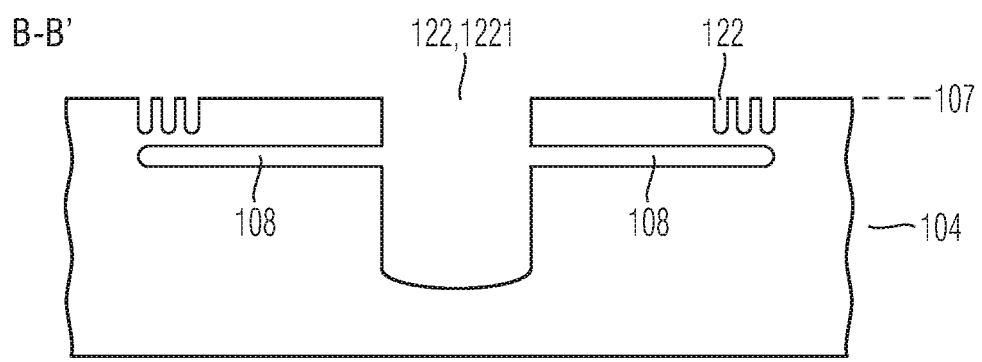
Figure 5D:
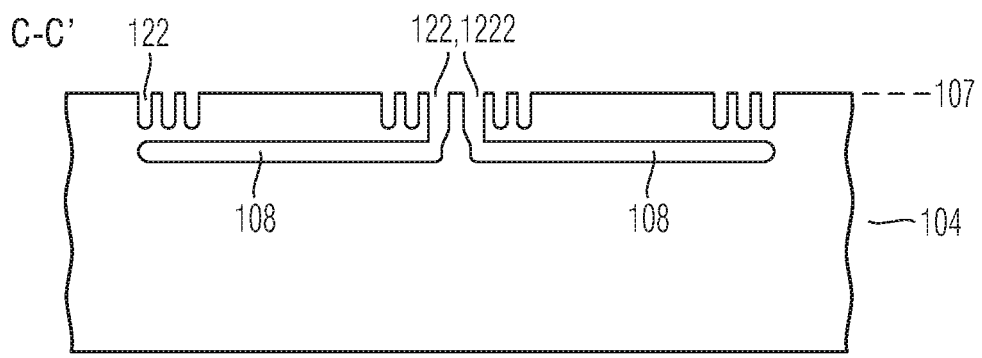

Referring to the schematic cross-sectional view of FIG. 5D along line C-C' of FIG. 5A, a trench segment 1222 reaches the cavity 108 without extending through the cavity 108.

The trenches 122, 1221, 1222 including trenches of different depth may be formed concurrently by making use of the so-called reactive ion etching (RIE) lag identifying an effect of an etch rate that is depending on the mask opening. In general, smaller trench openings are etched slower than wider trench opening, for example in reactive ion etching (RIE) using an $SF_6/O_2$ chemistry.

In the embodiment illustrated in FIG. 5A, two different trench segments 1221, 1222 are illustrated for accessing the cavity 108. In other embodiments, another number of same or different shaped trench segments may be present for accessing the cavity 108.

FIGS. 6A to 6D illustrate embodiments of forming a thermal oxide of a trench isolation structure 125 in the semiconductor body 104 illustrated in FIGS. 5A to 5D.

Figure 6A:
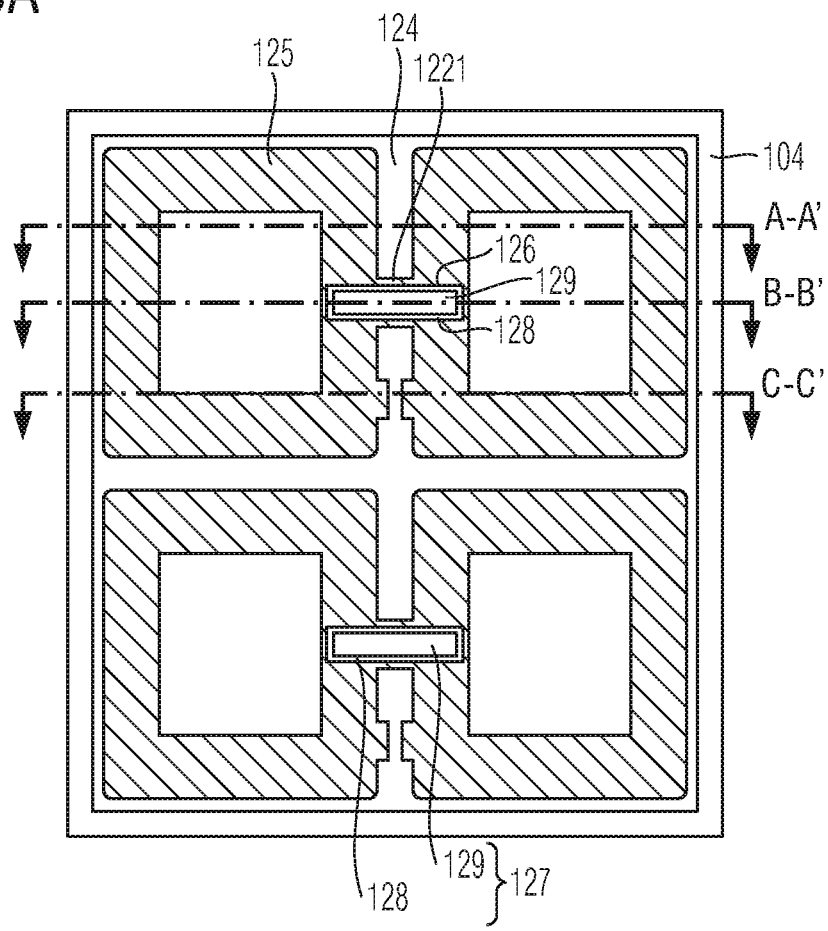

Referring to the schematic plan view of FIG. 6A, an optional hard mask layer 124, for example an oxide layer or a nitride layer may remain on the first surface 107 of the semiconductor body 104 after formation of the trench segments 122 (not illustrated in FIGS. 5A to 5D). The hard mask layer 124 may remain as a further mechanical support of the active area portions. A thermal oxidation process first lines walls of the trench segments 122 with a thermal oxide 126 and due to material consumption of the mesa regions 123 between the neighboring trench segments 122, the thermal oxides of opposite walls within one trench segment 122 as well as between neighboring trench segments 122 merge, leading to a continuous trench isolation structure 125. In the trench segment 1221, the thermal oxides 126 of opposite walls may not merge and the trench segment 1221 may be filled with up with at least one filling material 127.

By way of example, the at least one filling material 127 may include another oxide layer 128, for example based on a tetraethyl orthosilicate (TEOS) process and a polycrystalline layer 129, for example.

Figure 6B:
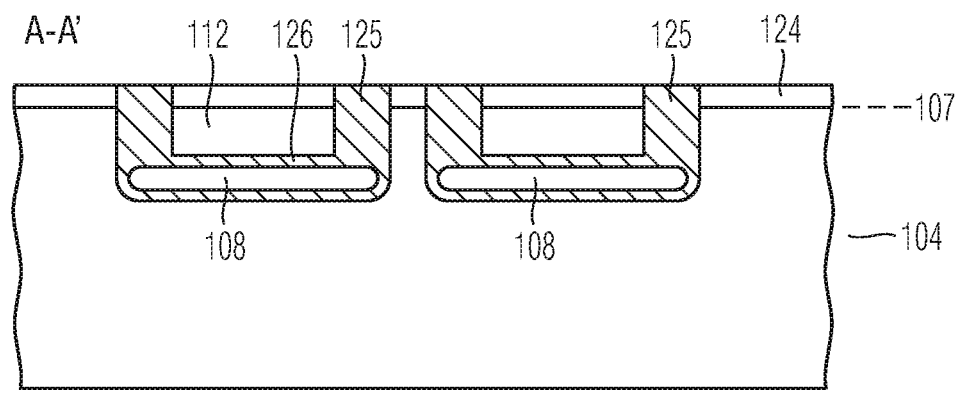

Referring to the schematic cross-sectional view of FIG. 6B along line A-A' of FIG. 6A, the thermal oxide 126 lining a surface of the cavity 108 and the thermal oxide of the trench isolation structure 125 merge. Thereby, a beneficial dielectric isolation of the active area portion 112 may be achieved.

Figure 6C:
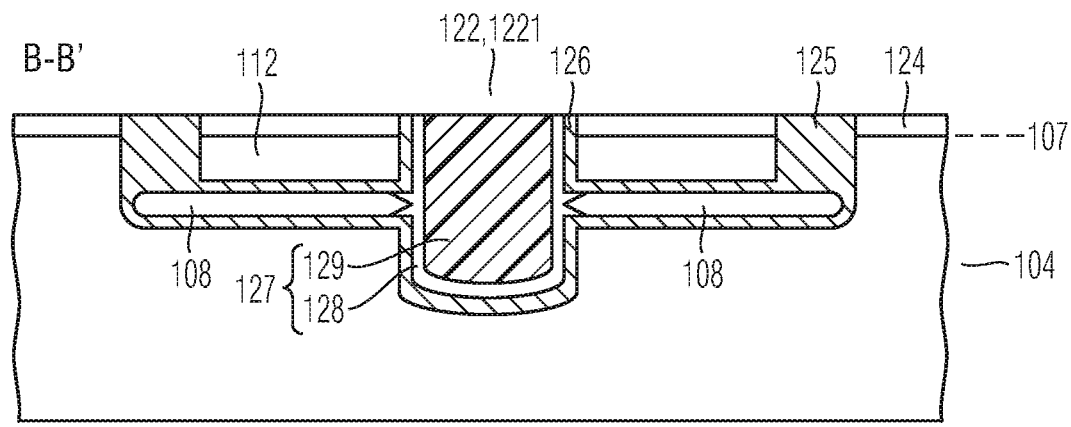

Referring to the schematic cross-sectional view of FIG. 6C along line B-B' of FIG. 6A, apart from the thermal oxide 126 lining walls and a bottom side of the trench segment 1221, the other oxide layer 128 and the polycrystalline silicon layer 129 fill up the trench segment 1221. The polycrystalline silicon layer 129 or any other conductive material filled in the trench segment 1221 may be used as a buried wiring and/or as a substrate contact to the semiconductor body 104 below the cavity 108 in case of removal of the thermal oxide 126 and the other oxide layer 128 from a bottom side of the trench segment 1221.

Figure 6D:
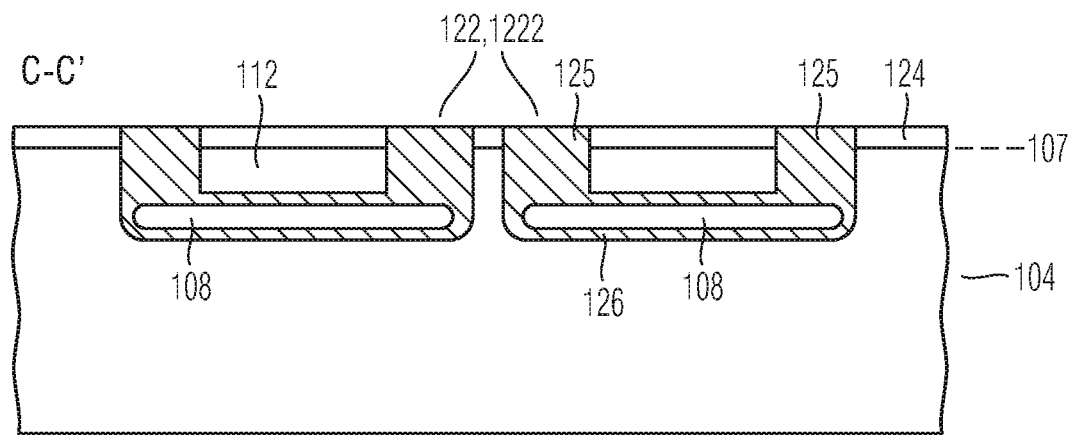

Referring to the schematic cross-sectional view of FIG. 6D along line C-C' of FIG. 6A, the thermal oxides of opposite walls within the trench segment 1222 and within surrounding trench segments 122 as well as between these segments merge, leading to the continuous trench isolation structure 125. The purpose of trench segment 1222 illustrated in FIG. 6A lies in the access of the cavity 108 for enabling a thermal oxidation process at the surface of the cavity 108.

Processing of the semiconductor body 104 based on process features as described with reference to the embodiments illustrated in FIGS. 1 to 6D may be used to manufacture semiconductor devices in the active area portions 112.

Figure 7:
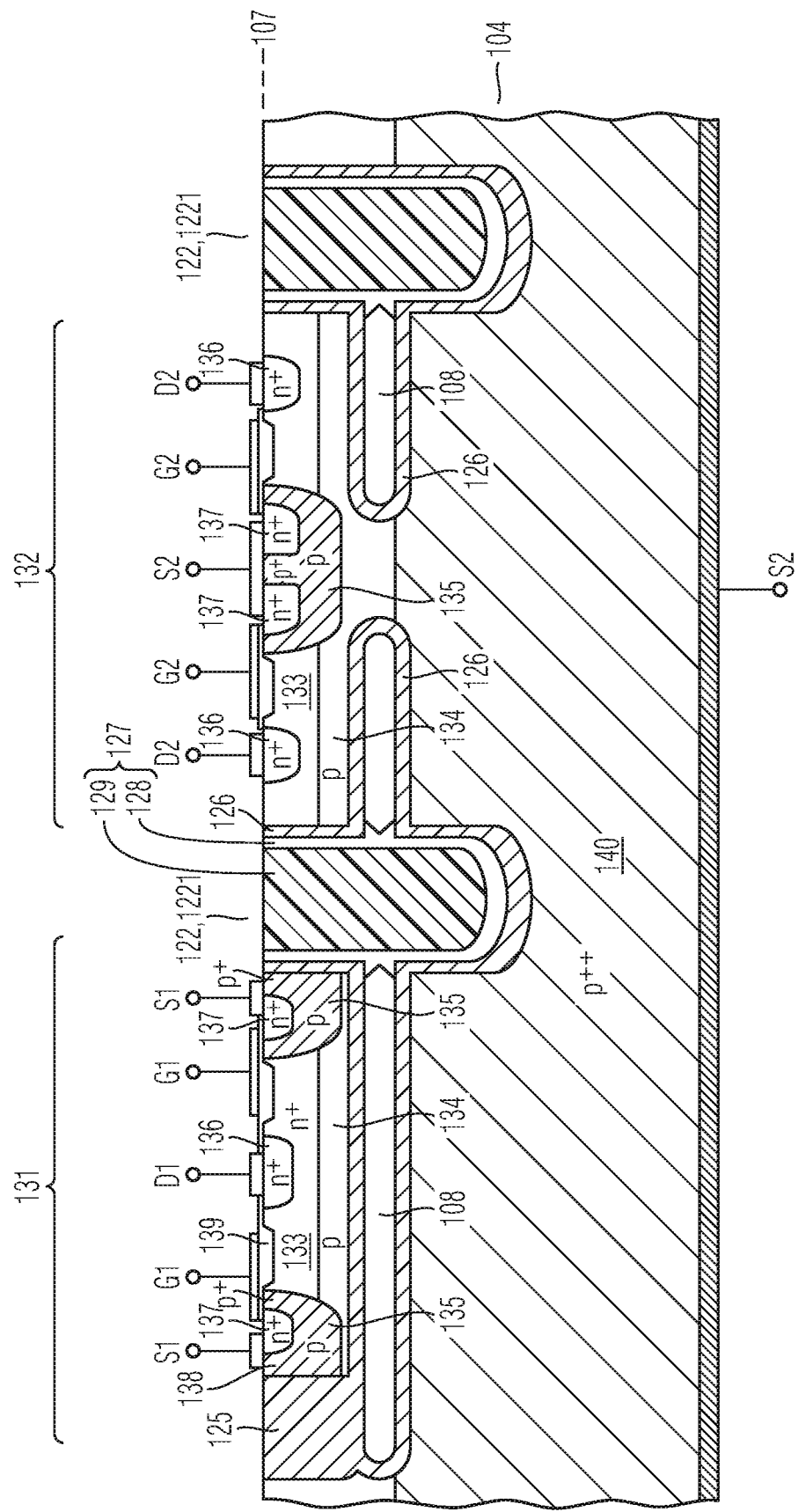
FIG. 7 is a schematic cross-sectional view of a semiconductor body 104 including a half bridge circuit formed by high-side and low-side IGFETs in active area portions electrically insulated by a trench isolation structure.

An embodiment of semiconductor devices manufactured in the active area portions 112 is illustrated in the schematic cross-sectional view of FIG. 7.

A first n-channel IGFET 131, for example a high-side MOSFET is formed in a first active area portion surrounded by the trench isolation structure 125. In the first active area portion, an n-type drift region 133 is surrounded by a p-type layer 134 and a p-type body region 135. The n-type drift region is electrically coupled to a drain electrode D1 via a highly doped n-type drain region 136. A source electrode S1 is electrically coupled to a highly doped n-type source region 137 and to the p-type body region 135 via a highly doped p-type body contact region 138. A dielectric structure 139 including a gate insolation layer and a trench isolation layer electrically insulates a gate electrode G1 and a channel-forming part of the p-type body region 135.

A second n-channel IGFET 132, for example a low-side MOSFET is formed in a second active area portion surrounded by the trench isolation structure 125. In the second active area portion, an opening in the cavity 108 provides an electric contact between the p-type layer 134 and a highly doped p-type substrate 140 electrically coupled to a source contact at a second surface of the semiconductor body 104 opposite to the first surface 107. Source, gate and drain electrodes S2, G2, D2 of the second n-channel IGFET 132 are electrically coupled with associated regions in the active area portion similar to the first n-channel IGFET 131.

Figure 8A:
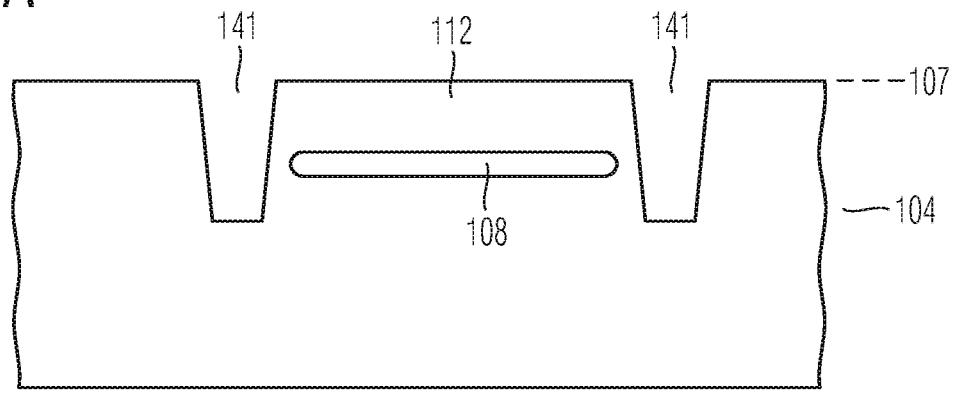
FIGS. 8A to 8C are schematic cross-sectional views of a semiconductor body for illustrating an embodiment of a method of forming a trench isolation structure in the semiconductor body.
Figure 8B:
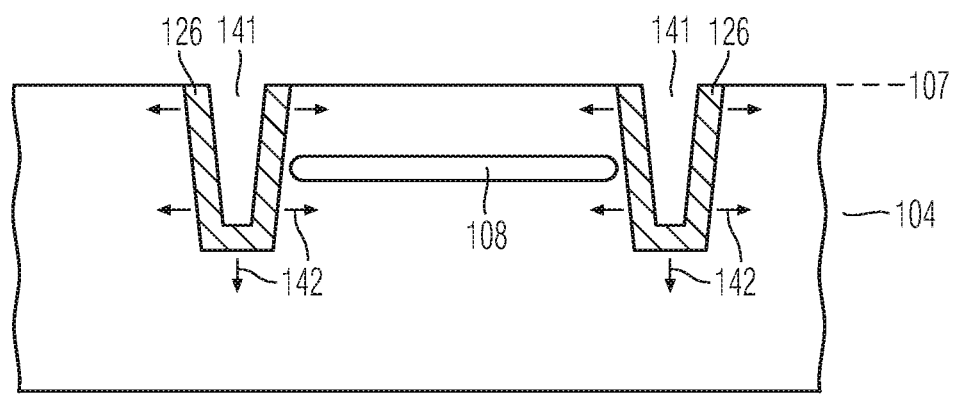
Figure 8C:
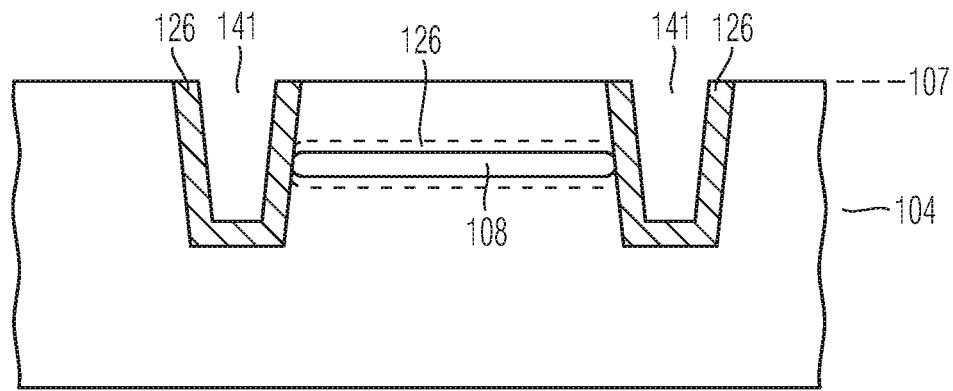

FIGS. 8A to 8C illustrate embodiments of forming a trench isolation structure in the semiconductor body 104 configured to provide a lateral electric isolation of an active area portion.

Referring to the schematic cross-sectional view of FIG. 8A, a trench 141 is formed in the semiconductor body 104 at the first surface 107, the trench 141 surrounding the active area portion 112 and the cavity 108.

Referring to the schematic cross-sectional view of FIG. 8B, a thermal oxidation process is carried out, leading to the thermal oxide 126 lining sidewalls and a bottom side of the trench 141 and increasing in thickness during growth along a direction indicated by arrows 142.

Referring to the schematic cross-sectional view of FIG. 8C, the thermal oxidation may be stopped when the thermal oxide 126 in the trench 141 adjoins lateral ends of the cavity 108, or, when the thermal oxide 126 in the trench 141 merges the thermal oxide 126 growing at a surface of the cavity 108, in case the cavity 108 can be accessed, for example by a process trench as is illustrated in FIGS. 2D, 5C, 5D. The trenches 141 may be further filled with dielectric and/or conductive material(s).

Embodiments described above may also provide benefits with respect to silicon-on-insulator (SOI) processes in view of wafer costs. In the embodiments described above, a lateral isolation may be formed in a flexible manner at any position on a wafer surface.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit, comprising:
 a cavity buried in a semiconductor body below a first surface of the semiconductor body;
  an active area portion of the semiconductor body arranged between the first surface and the cavity;
 a trench isolation structure that is filled with dielectric material configured to provide a lateral electric isolation of the active area portion; and
 a dielectric layer lining a surface of the cavity,
 wherein the dielectric material of the trench isolation structure and the dielectric layer of the cavity are merged and electrically isolate the active area portion from any surrounding part of the semiconductor body, wherein the dielectric material and the dielectric layer is an oxide of silicon,
 wherein the trench isolation structure fully surrounds the active area portion at the first surface, and
 wherein the trench isolation structure surrounding the active area portion at the first surface includes a first part encircling the active area portion to a smaller extent than a second part, and wherein a lateral width of the first part measured perpendicular to a circumferential line of the active area portion at the first surface is greater than a lateral width of the second part.

2. The integrated circuit of claim 1, wherein the trench isolation structure adjoins a side surface of the cavity.

3. The integrated circuit of claim 1, wherein the trench isolation structure adjoins a top surface of the cavity.

4. The integrated circuit of claim 1, wherein the semiconductor body is a silicon semiconductor body, and wherein the integrated circuit further comprises a SiGe layer buried in the active area portion between the cavity and the first surface.

5. An integrated circuit, comprising:
 a cavity buried in a semiconductor body below a first surface of the semiconductor body;
 an active area portion of the semiconductor body arranged between the first surface and the cavity;
 a trench isolation structure configured to provide a lateral electric isolation of the active area portion; and
 a trench extending through the active area portion, through the cavity, and into the semiconductor body.

6. An integrated circuit, comprising:
 a cavity buried in a semiconductor body below a first surface of the semiconductor body;
 an active area portion of the semiconductor body arranged between the first surface and the cavity;
 a trench isolation structure configured to provide a lateral electric isolation of the active area portion; and
 a half bridge circuit including a low side transistor and a high side transistor, wherein the high side transistor is located in the active area portion and the low side transistor is located in another active area portion arranged between the first surface and the cavity.

7. The integrated circuit of claim 6, further comprising a substrate contact extending through the other cavity and electrically coupling a source region of the low side transistor and a source contact at a second surface of the semiconductor body opposite the first surface.

8. An integrated circuit, comprising:
 a cavity buried in a semiconductor body below a first surface of the semiconductor body;
  an active area portion of the semiconductor body arranged between the first surface and the cavity;
 a trench isolation structure that is filled with dielectric material configured to provide a lateral electric isolation of the active area portion; and
 a dielectric layer lining a surface of the cavity,
 wherein the dielectric material of the trench isolation structure and the dielectric layer of the cavity are merged and electrically isolate the active area portion from any surrounding part of the semiconductor body, wherein the dielectric material and the dielectric layer is an oxide of silicon,
 wherein the semiconductor body is a silicon semiconductor body, and wherein the integrated circuit further comprises a SiGe layer buried in the active area portion between the cavity and the first surface.

* * * * *